United States Patent
Johnson et al.

(10) Patent No.: US 12,040,185 B2
(45) Date of Patent: Jul. 16, 2024

(54) SOLUTION-BASED DEPOSITION METHOD FOR PREPARING SEMICONDUCTING THIN FILMS VIA DISPERSED PARTICLE SELF-ASSEMBLY AT A LIQUID-LIQUID INTERFACE

(71) Applicant: TOYOTA MOTOR EUROPE, Brussels (BE)

(72) Inventors: Hannah Johnson, Brussels (BE); Sachin Kinge, Brussels (BE); Kevin Sivula, Bussigny (CH); Rebekah Anne Wells, Renens (CH)

(73) Assignee: TOYOTA MOTOR EUROPE, Brussels (BE)

( * ) Notice: Subject to any disclaimer, the term of this patent is extended or adjusted under 35 U.S.C. 154(b) by 260 days.

(21) Appl. No.: 17/613,324

(22) PCT Filed: May 22, 2019

(86) PCT No.: PCT/EP2019/063259
§ 371 (c)(1),
(2) Date: Nov. 22, 2021

(87) PCT Pub. No.: WO2020/233809
PCT Pub. Date: Nov. 26, 2020

(65) Prior Publication Data
US 2022/0230879 A1    Jul. 21, 2022

(51) Int. Cl.
*H01L 21/02*   (2006.01)
*B05D 1/20*    (2006.01)

(52) U.S. Cl.
CPC ........ *H01L 21/02568* (2013.01); *B05D 1/204* (2013.01); *B05D 1/206* (2013.01); *H01L 21/02422* (2013.01); *H01L 21/02628* (2013.01)

(58) Field of Classification Search
CPC ......... H01L 21/02483; H01L 21/02568; H01L 21/02422; H01L 21/02628; B05D 1/202;
(Continued)

(56) References Cited

U.S. PATENT DOCUMENTS

2011/0027497 A1    2/2011  Rueckes et al.

FOREIGN PATENT DOCUMENTS

EP    0 382 339 A1    8/1990
EP    1 647 334 A1    4/2006
(Continued)

OTHER PUBLICATIONS

Yu, X. et al., "Self-assembled 2D WSe2 thin films for photoelectrochemical hydrogen production," Nature Communications, 2015, 6, 7596, pp. 1-8.
(Continued)

*Primary Examiner* — Dale E Page
*Assistant Examiner* — Quovaunda Jefferson
(74) *Attorney, Agent, or Firm* — Oliff PLC (57) ABSTRACT

A device for coating semiconductor/semiconductor precursor particles on a flexible substrate and a preparation method of a semiconducting thin film, wherein the device includes: a container for a first and second solvent substantially immiscible; injection means for injecting a predetermined dispersion volume of at least one layered semiconductor particle material or its precursor(s), occurring at a liquid-liquid interface formed within the container and between the first and second solvent, and creating a particle film at the liquid-liquid interface; a first support means; substrate extracting means; substrate supply means; compression means, reducing a distance between particles and push the film onto the substrate, wherein the compression means includes several pushing means mounted on a drive device, wherein at least two of the several pushing means are at least
(Continued)

partially submerged in the second solvent during drive device rotation, and moved through the second solvent toward the first support means.

22 Claims, 4 Drawing Sheets (58) Field of Classification Search
CPC .... B05D 1/204; B05D 1/206; B05D 2401/10; B05D 2401/21
See application file for complete search history.

(56) References Cited

FOREIGN PATENT DOCUMENTS

| WO | 2016/094384 A2 | 6/2016 | |
|---|---|---|---|
| WO | 2017/219125 A1 | 12/2017 | |
| WO | WO-2020025146 A1 * | 2/2020 | ............. B05D 1/202 |

OTHER PUBLICATIONS

Biswas, S. et al., "A Novel Approach to Create a Highly Ordered Monolayer Film of Graphene Nanosheets at the Liquid-Liquid Interface," Nano Letters, 2009, vol. 9, No. 1, pp. 167-172.

Parchine, M. et al., "Large Area 2D and 3D Colloidal Photonic Crystals Fabricated by a Roll-to-Roll Langmuir-Blodgett method," Langmuir, vol. 32 (23), pp. 5862-5869.

Zhang, Y. et al.,"Langmuir films and uniform, large area, transparent coatings of chemically exfoliated MoS2 single layers," Journal of Materials Chemistry C, 2017, vol. 5, pp. 11275-11287.

Lim, Y.R. et al., "Roll-to-Roll Production of Layer-Controlled Molybdenum Disulfide: A Platform for 2D Semiconductor-Based Industrial Applications," Advanced Materials, 2017, 1705270, 8 pp.

Kohoutek, T. et al., "Large-area flexible colloidal photonic crystal film stickers for light trapping applications," Optical Materials Express, 2018, vol. 8, No. 4, pp. 960-967.

Shen, J. et al., "Liquid Phase Exfoliation of Two-Dimensional Materials by Directly Probing and Matching Surface Tension Components," Nano Letters, 2015, vol. 15, pp. 5449-5454.

Bhattacharjee, S., "DLS and zeta potential—What they are and what they are not?" Journal of Controlled Release, 2016, vol. 235, pp. 337-351.

Miremadi, B.K. et al., "New structures from exfoliated MoS2," Journal of Applied Physics, 1991, vol. 69, No. 9, pp. 6373-6379.

Feb. 28, 2020, International Search Report issued in International Patent Application No. PCT/EP2019/063259.

* cited by examiner

SOLUTION-BASED DEPOSITION METHOD FOR PREPARING SEMICONDUCTING THIN FILMS VIA DISPERSED PARTICLE SELF-ASSEMBLY AT A LIQUID-LIQUID INTERFACE

FIELD OF INVENTION

The present application concerns the fields of electronics, optoelectronics, gas sensing, electrochemistry, catalysis and energy conversion and storage.

BACKGROUND ART

One of the most demanding challenges in material science today is to develop new materials having the properties which suit specific applications.

In the technical field of optoelectronic devices, gas sensors and energy conversion/storage devices, layered transition metal dichalcogenides (TMDs), such as $MoS_2$, $WS_2$, $MoSe_2$ and $WSe_2$, have been identified as promising semiconducting 2D layered materials, since they exhibit particular electrical, optical and mechanical properties. In order to fully make use of these properties, research has been performed to obtain thin films of these materials.

A Langmuir-Blodgett method allows the fabrication of ultra-thin, highly ordered organic films. In principle, the basic idea of this method consists in dipping and pulling a solid substrate.

In this well-known method, a molecule dissolved in a non-polar volatile solvent is spread onto the surface of a polar solvent (sub phase), which leads to a formation of a one-molecule-thick layer (Langmuir monolayer), after the evaporation of the non-polar volatile solvent and application of surface pressure. Then the thus-formed film is deposited on a substrate by different methods, such as the Langmuir-Blogett vertical method, Langmuir-Shaefer method, horizontal precipitation method, and a roll-to-roll deposition method.

Here, processing liquid-phase exfoliated 2D flakes into a thin film in a continuous manner while avoiding restacking and aggregation of the flakes has remained a major technical challenge. Although on a laboratory scale, restacking can be avoided by self-assembly of the 2D nano-flakes at a liquid-liquid interface of two non-solvents for the flakes (Yu et al. [1] and Biswas et. al [2]), the ability to perform this liquid-liquid self-assembly and the subsequent flake deposition has remained a challenge at an industrial scale.

To date, [3], [4] and [5] disclose roll-to-roll Langmuir-Blodgett printing methods with a liquid-gas interface. However, these methods require high temperature conditions and/or chemical etching, and can not be conducted under ambient conditions.

[6] discloses a way to make and transfer large-area (100 $cm^2$) free-standing 2D or 3D colloidal photonic crystal (CPC) films deposited using a roll-to-roll Langmuir-Blodgett technique from silica or polymer particles.

[7] discloses a technique for rapid large-scale assembly of monolayers and multilayers of nanoelements on a variety of different substrates, the technique being based on self-assembly of nanoelements suspended at the interface between a polar solvent and a nonpolar solvent. The layer of nanoelements is collected onto a substrate at a shallow angle, forming a continuous monolayer or multilayer of nanoparticles which can be optionally patterned or can be transferred to other substrates to form components of nano-electronics, optical devices, and sensors.

[8] discloses a large-area monolayer of solvent dispersed nanomaterials and method of producing same. The method of the disclosure includes dripping a nanomaterial solvent into a container filled with water whereby the nanomaterial being dripped collects at the air-water interface to produce the large-area monolayer. In one embodiment, different nanomaterial solvents can be dripped, at predetermined intervals such that the resulting large-area monolayer includes at least two different nanomaterials.

[9] discloses compositions of the formula $MX_2$:Y, wherein $MX_2$ is a layer type transition metal dichalcogenide, M is a metal selected from the group consisting of niobium, tantalum, molybdenum and tungsten, X is a chalcogen selected from the group consisting of sulfur and selenium and Y is a material located between layers of $MX_2$. The compositions may be prepared by the steps of first forming a suspension of the $MX_2$ in a body of water. A liquid which is immiscible with water is added to the suspension. The suspension and immiscible liquid are agitated together to form a temporary emulsion. The emulsion is allowed to rest until the water and the liquid separate with an interface therebetween. A sheet-like composition of $MX_2$:Y forms at the interface. Preferably, the $MX_2$ is in exfoliated, singular molecular thickness layers suspended in the water.

Therefore the present invention aims at providing a method for preparing a semiconducting thin film, wherein the liquid-liquid self-assembly and the subsequent flake deposition is carried out in an efficient manner, in ambient conditions.

NON-PATENT LITERATURE REFERENCES

[1] X. Yu: Nat. Commun. 2015, 6, 7596: Self-assembled 2D $WSe_2$ thin films for photoelectrochemical hydrogen production
[2] S. Biswas: Nano Lett., 2009, 9, 167: A Novel Approach to Create a Highly Ordered Monolayer Film of Graphene Nanosheets at the Liquid-Liquid Interface
[3] M. Parchine, J. McGrath, M. Bardosova and M. E. Pemble: Langmuir, Vol. 32 (23), p. 5862-5869: Large area 2D and 3D colloidal photonic crystals fabricated by a roll-to-roll Langmuir-Blodgett method
[4] Y. Zhang et al.: J. Mater. Chem. C, 2017, 5, 11275: Langmuir films and uniform, large area, transparent coatings of chemically exfoliated $MoS_2$ single layers
[5] Y. R. Lim: Adv. Mater., 2017, 1705270: Roll-to-Roll Production of Layer-Controlled Molybdenum Disulfide: A Platform for 2D Semiconductor-Based Industrial Applications
[6] T. Kohoutek et al., Optical Materials Express, 2018, 8, 960; Large-area flexible colloidal photonic crystal film stickers for light trapping applications

PATENT LITERATURE

[7] WO 2016/094384 A2
[8] WO 2017/219125 A1
[9] EP 0 382 339 A1

SUMMARY OF THE INVENTION

The present invention relates to a device for coating semiconductor/semiconductor precursor particles on a flexible substrate, wherein the device comprises:
  a container (5) configured to contain a first solvent and a second solvent substantially immiscible with each other;

injection means (15) configured to inject a predetermined volume of a dispersion of at least one layered semiconductor material or its precursor(s) in the form of particles, the injection occurring at a liquid-liquid interface formed within the container (5) and between the first solvent and the second solvent, and creating a film of particles at the liquid-liquid interface;

a first support means (25) configured to be able to be at least partially submerged in the first solvent, wherein the first support means (25) is configured to support at least a portion of a substrate;

substrate extracting means configured to exert a force on the substrate causing the substrate to be drawn away from the liquid-liquid interface, substrate supply means configured to provide a supply of the substrate;

compression means (55), configured to reduce a distance between particles of the at least one layered semiconductor material or its precursor(s) of the film at the liquid-liquid interface and push the film onto the substrate; wherein the compression means (55) comprises a plurality of means for pushing (65) mounted on a drive device (75), the plurality of means for pushing (65) configured such that at least two of the plurality of means for pushing (65) may be at least partially submerged in the second solvent during rotation of the drive device (75), and moved through the second solvent toward the first support means (25).

DETAILED DESCRIPTION OF THE INVENTION

Definitions

The term "polar", as used herein, refers to "having a large dipolar moment". A polar solvent can have a dielectric constant of, for example, 10 or more. Examples of polar solvents are water, carboxylic acids such as acetic acid, alcohols such as methanol, ethanol, n-propanol or n-butanol, ketones such as acetone, organic sulfoxides such as dimethyl sulfoxide, organic nitriles such as acetonitrile and amides such as dimethylformamide.

The term "non-polar", as used herein, refers to "having a small dipolar moment". A non-polar solvent can have a dielectric constant of, for example 10 or less. Examples of non-polar solvents are linear or cyclic hydrocarbons such as benzene or hexane, ethers such as diethyl ether, halogenated hydrocarbons such as carbon tetrachloride and methylene chloride.

The term "miscible", as used herein, refers to two or more solvents which, when mixed together, form a single phase. In the case of two liquids, they may typically be miscible when the solubility of one solvent in the other is 10 g/100 g or more.

The term "immiscible", as used herein, refers to two or more solvents which, when mixed together, form two or more phases. In case of two liquids, they may typically be miscible when the solubility of one solvent in the other is less than 10 g/100 g.

The term "flexible" as used herein, refers to the feature that a substrate can be deformed. A flexible substrate, as used herein, may have a bend radius of 5 cm or less.

Device

Figure 1:
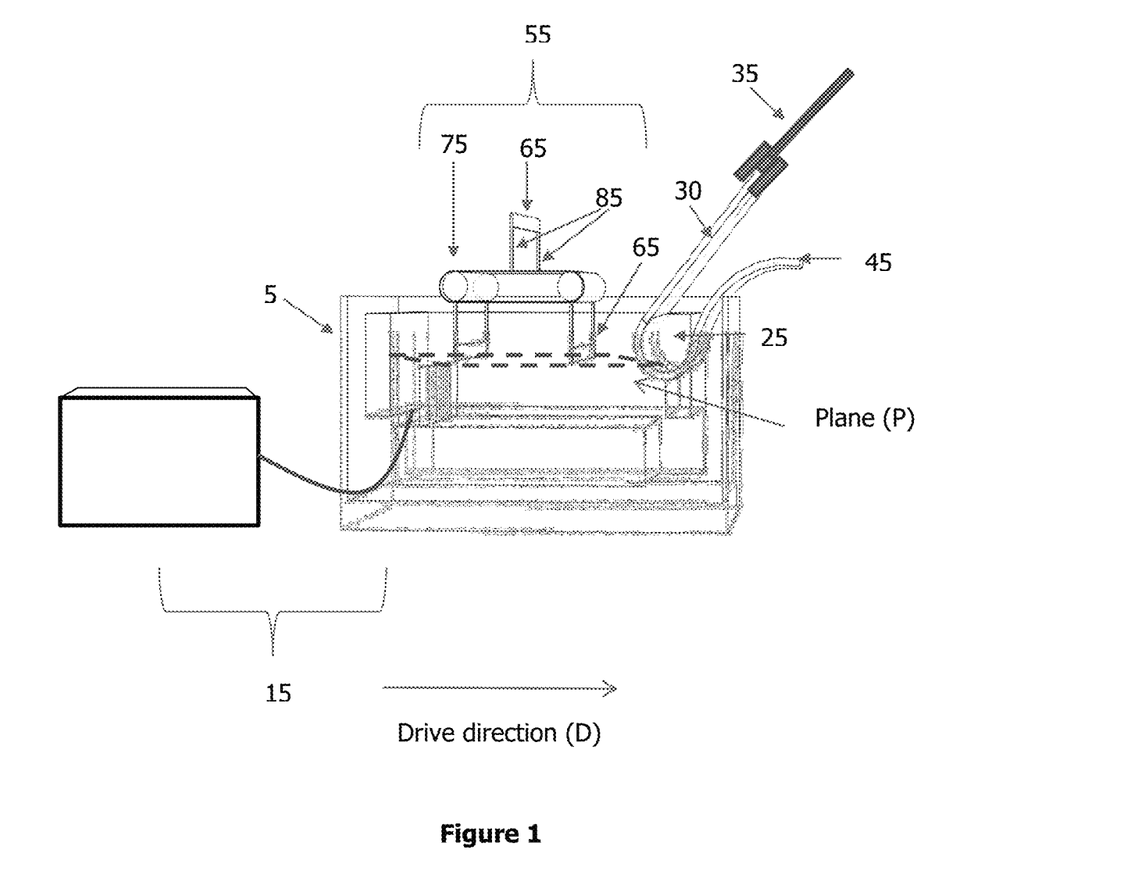
FIG. 1 is schematic representations of a non-limiting and illustrative example of devices for coating semiconductor precursor particles on a flexible substrate of the present invention, comprising: pusher belt system, drive motor (controlled by computer), plastic substrate, substrate extractor, Plexiglas bath for liquid-liquid-interface, dispersion injection manifold, "back wall" defining back edge of liquid-liquid interface, dispersion delivery system (2×10 mL syringe pumps), FIG. 1 being illustrative of particularly preferred embodiments.
Figure 2A:
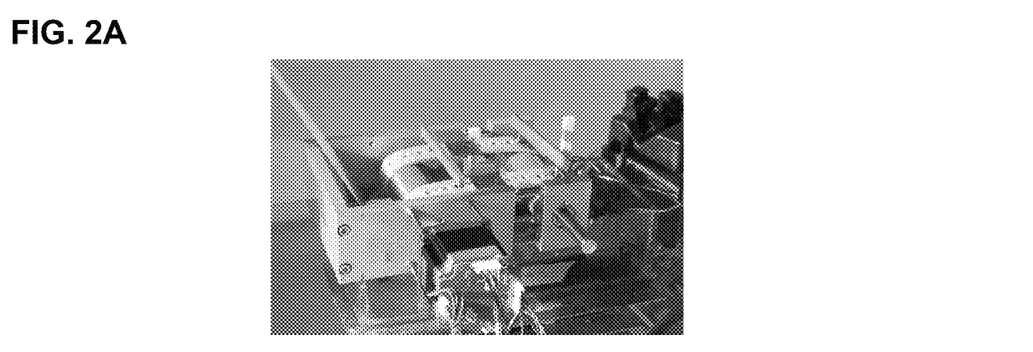
FIG. 2A to 2E are photographs of a device for coating semiconductor precursor particles on a flexible substrate: (a) entire device from another angle, (b) and (c) vision from upper side, (d) zoom on spool device, and (e) vision from the front side.
Figure 2B:
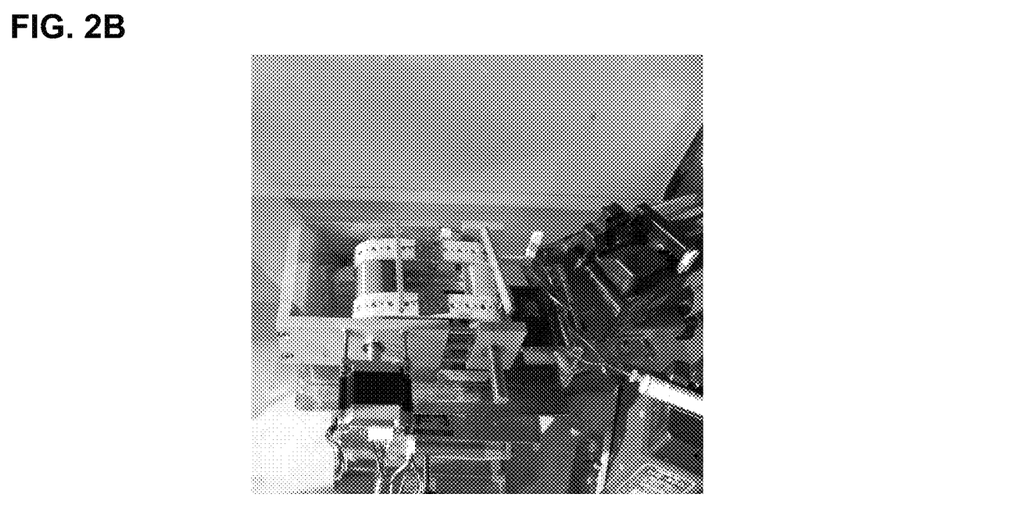
Figure 2C:
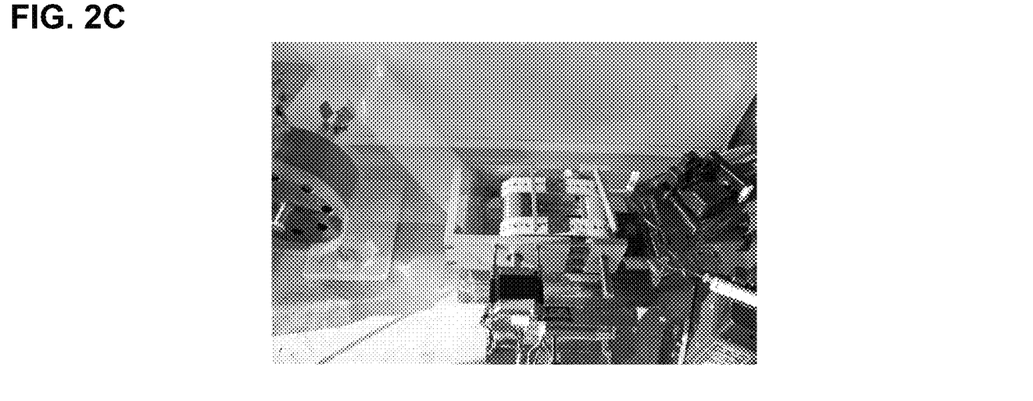
Figure 2D:
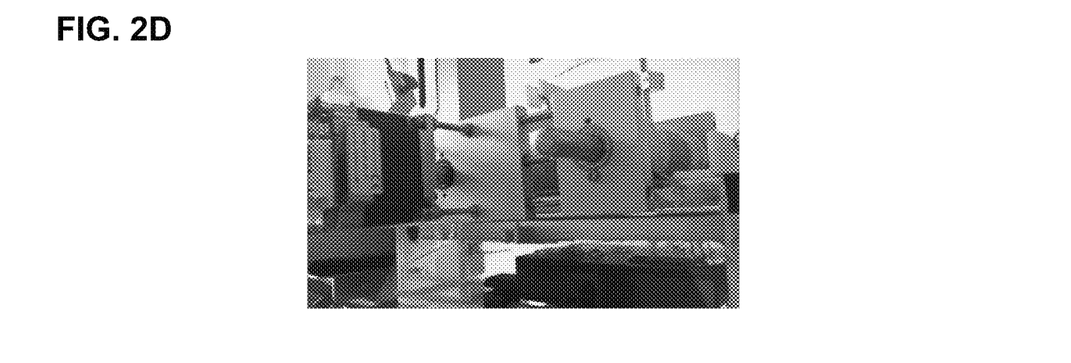
Figure 2E:
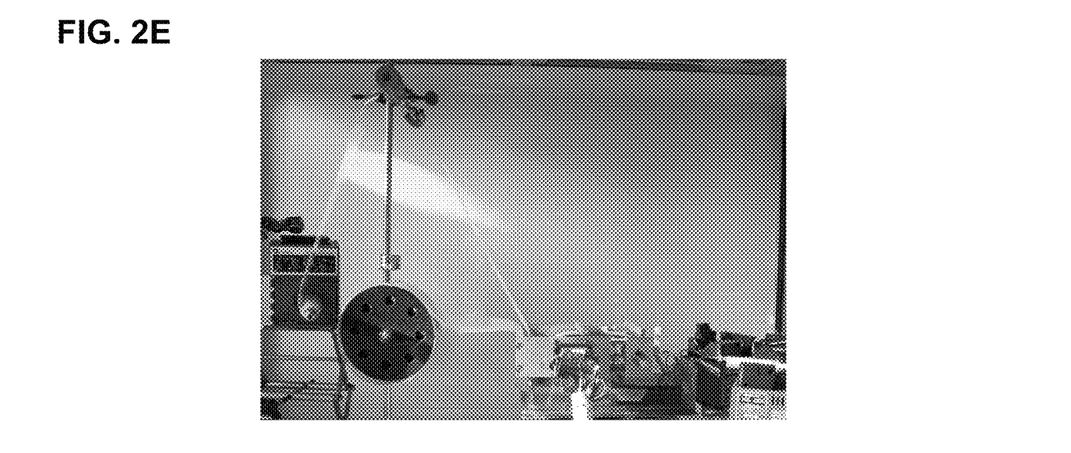
Figure 3:
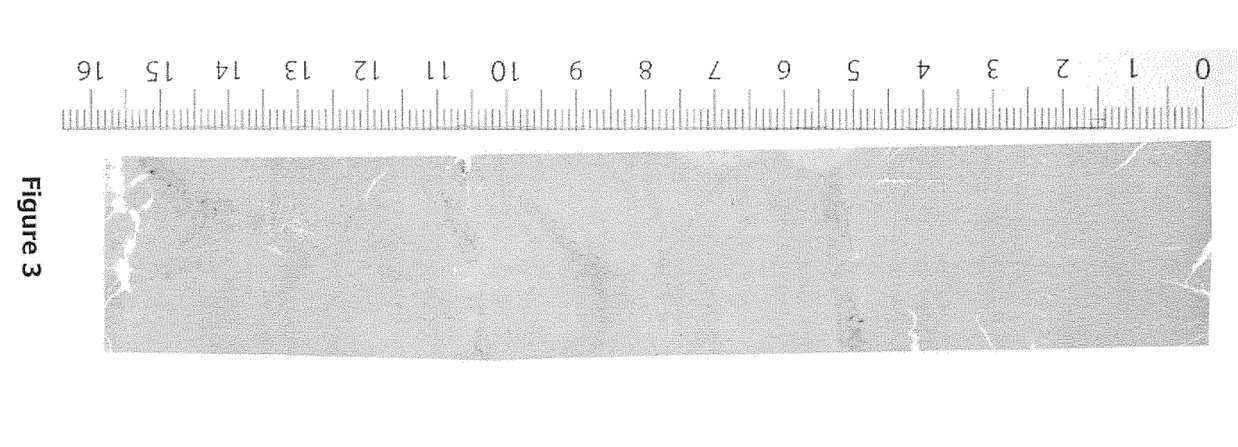
FIG. 3 is a photo of 300 $cm^2$ roll-to-roll printed film prepared with a device of the present invention.

FIG. 1 shows an exemplary configuration for the device according to the present disclosure. The device includes a container 5, injection means 15, a first support means 25, substrate extracting means 35, substrate supply means 45 and compression means 55.

Container

Container 5 is configured to contain a first 10 and second solvent 20, as well as to receive injections of particles 40 from injection means 15. By dispensing the first 10 and second 20 solvent into container 5, a liquid-liquid interface may be formed at a particular level within container 5 between first solvent 10 and second solvent 20. Container 5 may, therefore, be fabricated from any suitable material, for example, material having minimal or no reactivity or propensity to react with first 10 and second solvents 20. For example such materials may include, Acetal (Delrin®), Aluminum, Brass, Bronze, Buna N (Nitrile), Carbon graphite, Carbon Steel, Glass, Carpenter 20, Cast iron, Ceramic, Copper, CPVC, EPDM, Epoxy, Fluorocarbon (FKM), Hastelloy-C®, Hypalon®, Hytrel®, Kalrez, Kel-F®, Natural rubber, Neoprene, NORYL®, Nylon, Polyetherether Ketone (PEEK), Polypropylene, PPS (Ryton®), PTFE, PVC, PVDF (Kynar®), stainless steel—304, stainless steel—316, Titanium, Tygon® and Viton®.

Injection Means

Injection means 15 may comprise any suitable device configured to introduce a predetermined volume, depending on the surface area of the liquid-liquid interface (e.g. 2-3 ml for a surface area of 100 $cm^2$ in a laboratory scale device) of the dispersion into container 5, and particularly at liquid-liquid interface formed at the interface of the first 10 and second solvent 20. Examples of suitable injection means 15 can be found commercially at www.vwr.com (pipette tip or syringe needle).

In one preferred embodiment, injection means 15 may be configured to inject the dispersion from the bottom up to the liquid-liquid interface. This may be done, for example, by installing injectors on the bottom of the container.

Injection means 15 may be configured to inject or otherwise introduce the predetermined volume of the dispersion at a predefined interval. For example, injection means 15 may be configured to introduce the predetermined volume at an interval of 0.1 to 100 seconds. Alternatively, injection means 15 may be configured to perform continuous injection of the dispersion at a desired flow rate, e.g. 0.5 mL/s per 20 $cm^2$ of liquid/liquid surface area.

In one embodiment, injection means 15 may be an injector. An appropriate injector might be commercially available.

In one preferred embodiment, the injection means 15 comprise a plurality of needles fluidly connected to an injection manifold. Such a configuration might allow one to obtain a film without gaps or overlaps. The term "fluidly" as used herein means "in a continuous line".

The arrangement of the needles is flexible: needles can be in a straight line or staggered, for example, as long as the paddle dips down after the last needle (so that the last needle is not disrupting a complete film being moved towards the substrate).

In one preferred embodiment, the injection means 15 allows injection of the dispersion of at least one layered semiconductor material or its precursor(s) in the form of particles from underneath the first 10 and second 20 solvents in the container 5. Such a configuration allows one to obtain a film with more robustness, as well as leaving the injecting apparatus in place while means for pushing 65 move in and out of the solvent bath (more difficult for case wherein means for pushing 65 are evenly distributed over the entire bath).

Injection means 15 may be configured in such a way that injection speed is kept constant relative to the speed of means for pushing 65 and the speed of substrate extracting means 35. For example, if means for pushing 65 and substrate extracting means 35 are configured to increase the speed by a factor of 5, injection means 15 is to be configured to increase the speed by a factor of 5, assuming that the container volume is constant. This can be done, for example by increasing the number of injection means 15 and/or by increasing the speed of injection of each injection means 15. If the container volume is increased, for example by increasing the width of the container 5, resulting in an increase in film area, injection means 15 is to be configured to increase its speed, while means for pushing 65 and substrate extracting means 35 are to be configured to maintain the initial speed. For example, a device with an increased width may have more needle lines.

In the case of a laboratory scale device, injection means 15 may be configured in such a way that its total injection speed is comprised between 2 and 4 ml/min (the injection speed through each pair being 1-2 mL/min), in the case of a device with 4 needles and container 5 with a width of 10 cm. For an industrial scale device, the injection speed depends on the width of container 5, and an industrial scale device may be configured to have an injection speed of, for example, 0.025 mL/min·cm$^2$. In the case of a device having a width of container 5 of 1 m for providing a 1-meter-wide film (of any length) with 40 needles operating, for example, the total injection speed might be 10-20 mL/min (the injection speed through each pair being 1-2 mL/min).

Without wishing to be bound by any particular theory, the amount of injection means 15 may depend on the size of container 5 and thus the size of the film to be prepared. The amount of injection means 15 might also related to the injection rate: in order to obtain the same size of film, if the amount of injection means 15 is decreased, the injection rate is to be increased, and vice versa. For example, in a laboratory scale device, it is possible to use, for example, 8 needles as injection device 15, and an injection rate of 0.5 mL/min for each needle (i.e. 4 mL/min of total injection rate), and the speed of means for pushing 65 and the speed of substrate extracting means 35 of 1 mm/sec.

As shown in FIG. 1, in a preferred embodiment of the invention, the device of the present invention may have only one line of needles in the rear opposite side with respect to the substrate. Such a configuration may allow the film not to be disturbed by additional needles as it moves, since the film is built up as the means for pushing 65 moves from back to forth.

The needles may also be disposed in several lines in an array.

First Support Means

First support means 25 is at least partially submerged in the first solvent wherein the first support means 25 is configured to support at least a portion of a substrate 30.

First support means 25 may be configured to support a substrate 30 in motion and onto which semiconductor particles are to be deposited at a predetermined rate. First support means 25 may be positioned at least partially submerged in the first solvent 10, i.e., the solvent of greater density among the first 10 and second solvent 20, and may be configured to enable substrate 30 to move at a desired feed rate, for example, 0.1 to 1000 mm/min in case of a laboratory scale device and 60 mm/min or more in case of an industrial scale device. First support means 25 may comprise any suitable material for supporting substrate 30, for example, a polymer surrounding a metallic or composite based hub may be provided.

A position of first support means 25 may be configured to vary according to a level of the first solvent within container 5 such that first support means 25 may maintain a desired level of submersion within the first solvent 10. For example, first support means 25 may be provided with a floating member (not shown), such a floating member being positioned in relation to first support means 25 such that first support means 25 maintains its position relative to the liquid-liquid interface between the first and second solvents. In so doing, substrate 30 may be passed through both first solvent 10 and second solvent 20, such that particles 40 are distributed on a face of substrate 30 at a desired rate.

In one embodiment, first support means is a roller. An appropriate roller might be commercially available. One of skill will recognize that other configurations for supporting substrate 30 may be used in lieu of first support means 25. For example, a fixed plate having a desired angle relative to the liquid-liquid interface, and a friction-reducing coating with regard to substrate 30 may be provided.

Substrate Extracting Means

Substrate extracting means 35 is configured to exert a force on the substrate 30 causing the substrate to be drawn away from the liquid-liquid interface. Substrate extracting means 35 may be configured to exert a force on substrate 30 to draw substrate 30 away from the liquid-liquid interface at a desired, controlled rate. For example, substrate extracting means 35 may include a motor configured to rotate substrate extracting means 35 at a desired rate, resulting in rolling of substrate 30 upon itself at substrate extracting means 35.

Substrate extracting means 35 may comprise any suitable device configured to exert a predetermined force on the substrate in a constant manner. For example, substrate extracting means 35 may be configured to exert a traction force.

In one embodiment, substrate extraction means 35 may be commercially available.

In one embodiment, substrate extraction means 35 may be configured in such a way that it speed is substantially equal to the speed of means for pushing 65. In such a way, it is possible to avoid gaps or overlap in the film.

In case of a laboratory scale device, substrate extraction means 35 may be configured in such a way that its speed on comprised between 1 mm/sec and 5 mm/sec.

In one embodiment, the angle of substrate extraction with respect to the liquid-liquid interface is comprised between 10° and 90°, and preferably between 10° and 60° Such a range of angle of extraction allows one to prepare a film without gap or superposition.

Substrate Supply Means

Substrate supply means 45 is configured to provide a supply of the substrate 30. Substrate supply means 45 may be configured to support a supply of substrate 30, and to allow substrate 30 to be extracted from the supply at a controlled rate, e.g., based on a rate of rotation of substrate extraction means. One of skill in the art understands that any suitable support for supplying the substrate 30 may be implemented.

Substrate supply means 45 may comprise any suitable device configured to supply substrate at a predetermined speed in a constant manner.

Substrate supply means 45 may be configured to supply the substrate at a predetermined speed, for example at 60 mm/min.

In one embodiment, substrate supply means 45 may be commercially available: PETITO188-18 Solaronix provided by ITO COATED PET FILM MSE Supplies.

Compression Means

Compression means 55 is configured to reduce a distance between particles of the at least one layered semiconductor material or its precursor(s) of the film at the liquid-liquid interface and push the film onto the substrate 30, wherein the compression means 55 comprises a plurality of means for pushing 65 mounted on a drive device 75, the plurality of means for pushing configured such that at least two of the plurality of means for pushing 65 may be at least partially submerged in the second solvent 20 during rotation of the drive device 75, and moved through the second solvent 20 toward the first support means 25.

Drive Device

Drive device 75 may comprise any suitable device configured to rotate at a predetermined speed in a constant manner. Drive device 75 may be configured so that pushing means 65 is driven in drive direction (D) while it is submerged in the second solvent. Consequently, the film formed at the liquid-liquid interface is driven in the drive direction by pushing means 65.

In one embodiment, a drive device might be a spool belt device comprising spools and a belt. Spools may preferably be made of a material at least resistant to water, heptane and butyl alcohols, such as PETG, tetrafluoroethylene perfluoropropylene (FEP), ethylene-tetrafluoroethylene (ETFE), polyfluoroalkoxy (PFA), polyvinyl chloride (PVC) and polypropylene (PP), and the belt may preferably be made of a material, which preferably have some resistance to water, heptane and butyl alcohols, such as "Ninja flex" (polyurethane composition), FEP, ETFE, PFA, polyvinylidene fluoride (PVDF), PP, polychloroprorene (pc-rubber), metals and metal alloys.

When 3D-printing these materials at laboratory scale, the spools may preferably be made of PETG and the belt may preferably be made of "Ninja flex", provided by NinjaTek (https://ninjatek.com/ninjaflex/), due to printability. Such a material is more adapted to 3D printing.

Means for Pushing

A plurality of means for pushing 65 may be mounted on drive device 75 by any conventional method known to one of skill. For example, a plurality of means for pushing 65 may be mounted on a drive device 75, for example, by mechanical fixing. The height of means for pushing 65 may be adjustable. The means for pushing 65 may be configured to be long enough to pass through second non-polar solvent 20 to the liquid-liquid interface but short enough so as not to scrape the bottom of the container 5 or the substrate 30 after the film has been deposited and the means for pushing 65 is continuing on the drive device 75. This depends on the height of the container 5 and where the drive device 75 is located with respect to the substrate withdrawal site. A person skilled in the art is capable of appropriately selecting the length of means for pushing 65.

In one preferred embodiment, said plurality of means for pushing 65 is substantially perpendicular with respect to the drive device 75. Without wishing to be bound by any theory, such a configuration allows one to obtain a film with a more regular shape.

In one embodiment, means for pushing 65 may be configured in such a way that its speed is substantially equal to the speed of substrate extracting means 35. In this way, it is possible to avoid gaps or overlap in the film.

For a laboratory scale device, means for pushing 65 may be configured in such a way that its speed is, for example, between 1 mm/sec and 5 mm/sec.

For an industrial scale device, the speed of means for pushing 65 may be 1-3 mm/s.

In one embodiment, one means for pushing 65 comprises at least two substantially parallel pushing bars 85, mounted substantially perpendicularly with respect to the drive direction (D) and substantially perpendicularly with respect to the plane of the liquid-liquid interface of a first solvent and a second solvent (P), when it is submerged in the second solvent. Here, drive direction (D) is the direction into which the drive device 75 is driven when pushing means 65 is submerged in a second solvent, and consequently the film formed at the liquid-liquid interface of a first solvent and a second solvent 2 is driven.

An appropriate thickness may be the smallest thickness possible that allows suitable rigidity for pushing, and suitable attachment to the belt, and therefore may depend on the scale of the device. The thickness of the bar may be, for example, 3 mm or less.

In one preferred embodiment, at least three means for pushing 65, each consisting of one pushing bar, are mounted on drive device 75, i.e. at least 3 pushing bars in total are mounted, preferably substantially perpendicularly with respect to drive direction (D) and substantially perpendicularly with respect to plane (P), when it is submerged in the second solvent.

In another embodiment, at least three means for pushing 65, each consisting of two parallel pushing bars, are mounted on drive device 75, i.e. at least 6 pushing bars in total are mounted preferably substantially perpendicularly with respect to drive direction (D) and substantially perpendicularly with respect to plane (P), when it is submerged in the second solvent.

In one preferred embodiment, the shortest distance between opposing faces of the two substantially parallel pushing bars 85 is at least 50 mm and at most 150 mm.

Bars 85 may be made of materials resistant to water, heptane, tert-butanol and 1-butanol, and may be able to maintain a straight line in the liquids but do not need to be strictly rigid.

In one preferred embodiment, pushing bars 85 are made of a fluorinated plastic, preferably PTFE, tetrafluoroethylene-perfluoropropylene (FEP), ethylene-tetrafluoroethylene (ETFE), polyfluoroalkoxy (PFA), polyvinylidene fluoride (PVDF), aluminium, steel, brass or stainless steel.

Polyethylene terephthalate (PET) may be used for a short term, but may need to be replaced over a longer period.

In one preferred embodiment, the drive device 75 comprises elements made of: FEP, ETFE, PFA, PVDF, polyvinyl chloride (PVC), polypropylene (PP); polyurethane; polychloroprene (pc-rubber); metals or metal alloys.

In one preferred embodiment, the first support means 25, the substrate extracting means, and the substrate supply means, each comprise one or more rollers.

In one preferred embodiment, a paddle belt forms an exemplary compression means 55 configured to reduce a distance between particles of semiconductor present in the dispersion at the liquid-liquid interface before and/or during application to substrate 30. According to embodiments of the disclosure, paddle belt 60 may comprise one or more paddles 60 configured to revolve about a set of rollers in a direction causing a flow in the second 20 and/or first solvents 10 so as to exert a pressing force on particles 40 in the dispersion in a direction toward substrate 30. Paddles 60 may comprise any suitable material, for example, an elastic polymer such as polytetrafluoroethylene (PTFE).

Each paddle 60 may therefore span a width of container 5, and may move a suitable velocity for creating a desired level of compaction between the particles 40 of the dispersion, such that upon reaching substrate 30, the particles 40 are aligned and compressed to a desired density upon the surface of substrate 30. In other words, a period between the revolving paddles 60, based on a velocity of the paddles 60 and the spacing there between, may be approximately equal to a desired length of a finished semiconductor thin-film segment having a desired particle dispersion per unit area (e.g., $10^{11}$-$10^{14}$ particles per $m^2$).

Configuration of Device when Operating

The height of the water layer must be above the level of injection means (e.g. needles). The height of the polar first solvent may be above the level of the injection means 15, and the height of the non-polar second solvent 20 may be below the drive device 75, and is only restricted by the height of the container or the height of the drive device 75.

Injection means 15 are disposed in a manner not to disturbing the movement of means for pushing 65. A person skilled in the art is capable of achieving such a configuration, for example by adjusting the relative position of injection means 15 and means for pushing 65. For example, when needles are used as injections means 15 and paddles are used as means for pushing 65, the device may preferably be configured in such a way that the paddles dip down after the last needle. Such a configuration would allow one to make sure that the last needle is not disrupting a complete film being moved towards the substrate.

When 8 needles are used as injection means 15 and 2 paddles separated from each other by a distance of 8 mm are used as pushing means 65, in a container having a width of 10 mm and 10 films are deposited successively, the total film area can be calculated as to be 10 mm (width of the container)×8 mm (distance between paddles)×8 (number of needles)×10 (number of films consecutively deposed)=6400 $mm^2$.

When the volume of the container is increased (for example, by increasing the width of the container), the injection speed can be increased to a certain point and/or additionally needles may be added to accommodate volume increase.

<Method for Preparing a Semiconducting Thin Film>

The method for preparing a semiconducting thin film of the present invention comprises the following steps:

(1) providing a liquid-liquid interface of a first solvent and a second solvent, wherein the first solvent is polar and the second solvent is non-polar;

(2) providing at least one layered semiconductor material or its precursor(s) in the form of particles in a third solvent in the form of a dispersion;

(3) injecting the dispersion of step (2) at the liquid-liquid interface obtained in step (1), in order to obtain an assembly of semiconductor/semiconductor precursor particles at the liquid-liquid interface;

(4) bringing the assembly of semiconductor/semiconductor precursor particles at the liquid-liquid interface obtained in step (3) into contact with a flexible substrate; and (5) applying a surface pressure to the dispersion obtained in step (4), using the compression means 55 comprising means for pushing 65 mounted on a drive device 75, in order to obtain a particle film of semiconductor/semiconductor precursor on the substrate, wherein the first solvent has a higher density than the second solvent; wherein the first solvent and the second solvent are immiscible with each other and their densities are different by at least 0.01 g/mL; and wherein the third solvent is miscible with at least one of the first solvent or the second solvent.

Starting Materials

<Layered Semiconductor Material>

The layered semiconducting material can be, for example, C (graphene), P (phosporene), h-BN (hexagonal boron nitride), InSe, GaSe, GaS, GaTe GeAs, SiAs, InSe, $Bi_2Se_3$, $SnS_2$, $MoS_2$, $WS_2$, $MoSe_2$, $WSe_2$, $WTe_2$ and $MoTe_2$.

Preferably, the layered semiconducting material can be a transition metal dichalcogenide, for example, $MoS_2$, $WS_2$, $MoSe_2$, $WSe_2$ and $MoTe_2$.

Precursors of layered semiconductor material can be metal oxides, such as $MoO_3$, $WO_3$, $SnO_2$, $Ga_2O_3$, metal fluorides, organometallics, catalytic metals, polymers such as polyethylene, polymethyl methacrylate (PMMA), polypropylene (PP), polystyrene (PS), polyvinyl chloride (PVC), polyvinylalcool (PVA), pure metals such as Mo, W, Si, Ge, metal nitrides such as GaN, WN, MoN.

Preferred precursors of layered semiconductor material are metal oxides, such as $MoO_3$, $WO_3$, and pure metals such as W and Mo.

<Preparation of Layered Semiconductor Material>

The layered semiconductor material used in the present invention can be prepared, for example, by a mechanical exfoliation method, a liquid exfoliation method, or a chemical exfoliation method of the bulk starting material. Alternatively, a sulfurization of metal (or metal oxide) thin film, vaporization of metal oxide with chalcogenide precursor can also be used.

Preferably, the layered semiconductor material used in the present invention is prepared by a mechanical exfoliation method or a liquid exfoliation method.

The first solvent and the second solvent are selected in such a way that they both will not disperse the particles of layered semiconductor materials to be deposited.

<Particle Size and Shape>

The layered semiconductor material may be in the form of particles of one to several atomic layers, having a thickness of 0.5 nm or more and 100 nm or less, preferably 1 nm or more and 10 nm or less, and more preferably 5 nm or more and 10 nm or less, and a diameter in a direction perpendicular to the thickness of 20 nm or more and 10 µm or less, preferably 200 nm or more and 1 µm or less.

In a preferred embodiment, particles may be nanoflakes wherein the thickness is significantly smaller than the diameter in a direction perpendicular to the thickness.

As used herein, the term "significantly", indicates, for example, that the thickness is smaller than the diameter in a direction perpendicular to the thickness by a ratio of $1/100$ or less.

Most preferably, the particles (or the nanoflakes) have a thickness of 1 nm or more and 10 nm or less, with a significantly larger diameter in a direction perpendicular to the thickness direction of 20 nm or more and 10 μm or less, more preferably of 200 nm or more and 1 μm or less.

<First Solvent>

The first solvent, which is polar, has a higher density than the second solvent, which is non-polar, and the first solvent is immiscible with the second solvent, which is non-polar. Therefore when a first solvent and a second solvent are put in contact, an interface between the first solvent and the second solvent can be obtained, the first solvent being under the second polar solvent, because of the difference in density.

The density of the first solvent can be, for example, 0.8 g/mL or more and 2.0 g/mL or less.

The first solvent has a density higher than that of the second solvent by at least 0.01 g/mL, preferably by 0.05 g/mL and more preferably by 0.1 g/mL.

The dielectric constant of the first solvent can be, for example, 10 or more.

The first solvent can be, for example, water, a carboxylic acid such as acetic acid, an alcohol such as ethylene glycol, methanol, ethanol, n-propanol or n-butanol, a ketone such as acetone, an acetate such as ethyl acetate, an organic sulfoxide such as dimethyl sulfoxide, an organic nitrile such as acetonitrile and an amide such as dimethylformamide (DMF) or dimethylsulfoxide (DMSO) or a mixture thereof.

Preferably, the first solvent is water, ethylene glycol, acetonitrile, or mixtures thereof in any proportion.

<Second Solvent>

The second solvent, which is non-polar, has a lower density than the first solvent, which is polar, and the second solvent is immiscible with the first solvent. Therefore when a first solvent and a second solvent are put in contact, an interface between the first solvent and the second solvent can be obtained, the second solvent being over the first solvent, because of the difference in density.

The density of the second solvent can be, for example, 1.2 g/mL or less and 0.5 g/mL or more.

The second solvent has a density lower than that of the first solvent by at least 0.01 g/mL, preferably by 0.05 g/mL and more preferably by 0.1 g/mL.

The dielectric constant of the second solvent can be, for example, 10 or less.

The second solvent can be, for example, a linear or cyclic hydrocarbon such as, pentane, hexane, heptane, octane or benzene, an ether such as diethyl ether, or a mixture thereof.

Preferably second solvent is a C5-C8 alkane.

More preferably, the second solvent is hexane or heptane, which has a low boiling point and therefore is easy to remove.

<Third Solvent>

The layered semiconductor material is dispersed in a third solvent.

The third solvent is soluble/miscible at least in one of the first solvent or the second solvent.

The third solvent has a density of 0.5 g/mL or more and 2.0 g/mL or less.

The third solvent has a dielectric constant of 0 or more and 100 or less.

The third solvent can be, for example, C4-C8 amines or alcohols such as hexylamine, butanol, hexanol, isopropanol (IPA) or a mixture thereof.

Advantageously, a more stable dispersion of particles can be prepared with a third solvent having a more similar surface energy as that of the particles.

The surface energy can be measured, for example, by using a contact angle measurement. This method is detailed for example in Nano Lett., 2015, 15 (8), pp 5449-5454, DOI: 10.1021/acs.nanolett.5b01842.

Some advantageous combinations of third solvent and particles satisfying the above condition are, for example, (third solvent, particle)=(1:1 IPA/water, graphene), (1:1 IPA/water, $WS_2$), (1:1 IPA/water, h-BN), (1:1 IPA/water, $MoSe_2$), (1:4 IPA/water, $Bi_2Se_3$), (1:4 IPA/water, $SnS_2$), (7:3 IPA/water, $MoS_2$), and (acetonitrile, $TaS_2$).

Advantageously, a more stable dispersion of particles can be prepared with a third solvent having an ionic strength closer to the pZC (point of zero charge) of the particles.

pZC can be estimated, for example, by using a Dynamic Light Scattering apparatus. This device is detailed, for example in J. Control. Release, 235 (2016) 337-351.

pZC can be adjusted by changing the pH. For example, the pZC is about pH=2-3 for $MoS_2$, and pZC is close to pH=1 for $WS_2$ (J. Appl. Phys. 69, 6373(1991)).

The pH can be adjusted by adding an acid or a base. Examples of acid are HCl, $H_2SO_4$ and acetic acid. Examples of base are NaOH, ammonium hydroxide and methyl amine.

Preferably, the third solvent is hexylamine ($CH_3(CH_2)_4CH_2$—$NH_2$), hexanol ($CH_3(CH_2)_4CH_2$—OH), tert-butanol, IPA, water, acetonitrile or a mixture thereof.

<Combination of the Solvents>

The first solvent and the second solvent are immiscible with each other and the first solvent has a higher density than the second solvent.

The third solvent is miscible with at least one the first solvent and the second solvent.

Possible combinations of a first solvent, a second solvent and a third solvent, can be, for example, (first solvent, second solvent, third solvent)=(ethylene glycol, hexane, hexylamine), (mixture of water and acetonitrile, pentane, tert-butanol), (water, heptane, n-butanol).

Preferable combinations of a first solvent, a second solvent and a third solvent are (first solvent, second solvent, third solvent)=(water, heptane, n-butanol).

<Flexible Substrate>

The substrate on which a semiconducting thin film is deposited is not particularly limited, as long as it is flexible.

The flexible substrate used in the method of the present invention may have a bend radius of 5 cm or less.

The flexible substrate used in the method of the present invention can be, for example, polyethylene terephthalate (PET), polyethylene (PE), polyvinyl chloride (PVC), polypropylene (PP), polystyrene (PS), polylactic acid (PLA), polycarbonate (PC), acrylic (PMMA), flexible glass (such as Willow glass commercialized by Corning) and polyether ether ketone (PEEK). PEEK is preferable if the obtained film is subsequently subjected to a thermal treatment, since PEEK has enhanced thermal resistance compared to the other candidate materials (250° C. in operating conditions). These substrate materials shall advantageously not be etched, dissolved or otherwise damaged by the solvents employed under standard conditions.

The flexible substrate used in the method of the present invention can have a thickness of 0.001 mm to 10 mm.

The flexible substrate used in the method of the present invention is preferably electronically conductive for the intended use in semiconductor devices. The flexible substrate is also preferably transparent or semitransparent to visible and near infra-red (NIR) irradiation, for the intended application. A preferred flexible substrate is indium tin oxide (ITO) or fluorine-doped tin oxide (FTO)-coated polyethyleneterephthalate (PET).

Method Steps

<Step (1): Interface of a First Solvent and a Second Solvent>

Step (1) of the present method consists in providing a liquid-liquid interface of a first solvent and a second solvent.

This step can be carried out, for example, by first pouring a first solvent and then pouring a second solvent into a container 5. The solvents could also be added from any point on the wall or bottom of the container 5 through a supply tube.

The volume ratio between a first solvent and a second solvent can be, for example, any ratio of (first solvent volume):(second solvent volume)=10000:1 or more and 1:10000, or less, preferably 1000:1 or more and 1:1000, or less, more preferably 100:1 or more and 1:100, or less, still more preferably 10:1 or more and 1:10 or less and most preferably about 5:1 or more and 1:5 or less.

Step (1) can be carried out at room temperature, or at any combination of temperature and pressure wherein the solvents are in a liquid state.

Step (1) can be carried out in a trough of a width equal to the width of the substrate to be deposited on and composed of materials that will not be etched, dissolved or otherwise damaged by the solvents employed under standard conditions (i.e. 20° C. and 1 atm).

Step (1) can be carried out after step (2).

<Step (2): Dispersion of Layered Semiconductor Material or its Precursor(s)>

Step (2) of the present method consists in providing at least one layered semiconductor material or its precursor(s) particles in a third solvent in the form of a dispersion.

This step can be carried out, for example, by mixing layered semiconductor material or its precursor(s) with a third solvent.

The amount of layered semiconductor material or its precursor(s) by weight with respect to the volume of the third solvent can be, for example 0.001 mg/mL or more and 1000 mg/mL or less and preferably 0.01 mg/mL or more and 100 mg/mL or less, more preferably, 0.1 mg/mL or more and 10 mL or less and most preferably about 10 mg/mL.

Step (2) can be carried out at room temperature or at any combination of temperature and pressure wherein the solvents are in liquid state, i.e. under a given pressure, any temperature between the boiling point of the solvent having the lowest boiling point among all the solvents used, and the melting point of the solvent having the highest melting point among all the solvents used.

Step (2) can be carried out after step (1).

The dispersion may have a viscosity of 0.1 cp or more and 10 cp or less.

<Step (3): Injection of the Dispersion at the Liquid-Liquid Interface>

Step (3) of the present method consists in injecting the dispersion of step (2) at the liquid-liquid interface obtained in step (1), in order to obtain an assembly of semiconductor/semiconductor precursor particles at the liquid-liquid interface.

As used herein, the expression "assembly of semiconductor/semiconductor precursor particles" indicates the intermediate product obtained at the end of step (3).

This step can be carried out, for example by injecting continuously, or in sequential pulses by a pipette or syringe needle at one or more points in proximity to the liquid-liquid junction.

The injection speed can be, for example, 0.01 mL/min per square cm of liquid-liquid interfacial area or more and 100 mL/min per square cm of liquid-liquid interfacial area or less.

Preferably, the injection speed is 0.01 mL/min per square cm of liquid-liquid interfacial area or more and 1.0 mL/min per square cm of liquid-liquid interfacial area or less.

Most preferably, the injection speed is about 0.025 mL/min per square cm of liquid-liquid interface area.

It is believed that the thickness of the injected dispersion corresponds at least to the thickness of particles, and preferably of nanoflakes, and can be, for example, 0.5 mm or more and 20 nm or less.

Preferably, the thickness of the injected dispersion is 1 nm or more and 10 nm or less.

The injection can be carried out either from above or from below the interface of the liquid-liquid interface obtained in step (1).

Step (3) can be carried out at room temperature, or at any combination of temperature and pressure wherein the solvents are in a liquid state.

<Step (4): Contact with a Flexible Substrate>

Step (4) of the present method consists in bringing the assembly of semiconductor/semiconductor precursor particles at the liquid-liquid interface obtained in step (3) into contact with a flexible substrate.

This step can be carried out, for example, by a device as disclosed below.

Step (4) can be carried out at room temperature or at any combination of temperature and pressure wherein the solvents are in a liquid state.

<Step (5): Deposition Rate>

Step (5) of the present method consists in applying a surface pressure to the dispersion obtained in step (4), using the compression means 55, in order to obtain a flake film of semiconductor/semiconductor precursor on the substrate.

This step can be carried out, for example, by a vertical method, Langmuir-Schafer method, a roll-to-roll deposition method.

Preferably, this method is carried out by a roll-to-roll deposition method, since this is suitable for continuous film production.

More preferably, this step is carried out with the device as disclosed below.

The surface pressure can be controlled, for example, by using a predetermined range of deposition rate.

For example, a deposition rate of 1 mm/min or more and 1000 mm/min or less can be used in step (5).

Preferably, the deposition rate in step (5) is 10 mm/min or more and 100 mm/min or less.

More preferably, the deposition rate in step (5) is 40 mm/min or more and 80 mm/min or less.

Most preferably, the deposition rate in step (5) is about 60 mm/min.

Most preferably, a deposition rate of about 60 mm/min or less can be used in step (5).

Step (5) can be carried out at room temperature or at any combination of temperature and pressure wherein the solvents are in a liquid state.

The thickness of the obtained film can be, for example, 0.5 mm or more and 1000 nm or less.

Preferably, the thickness of the obtained film is 1.0 nm or more and 100 nm or less.

Preferably, the thickness of the obtained film is 1 nm or more and 10 nm or less.

<Order of the Steps>

The order for carrying out step (1) and step (2) is not particularly limited, i.e. step (1) can be carried out first, and then step (2) is carried out, step (2) can be carried out first, and then step (1) is carried out, or steps (1) and (2) can be carried out simultaneously.

In one embodiment, steps (1) to (5) are carried out in the order of the number of steps, i.e. first, step (1), then step (2), step (3), step (4), and finally step (5).

INDUSTRIAL APPLICATION

The semiconducting thin film obtainable using the present device and by the present method can be used in the technical field of electronics, optoelectronics, gas sensing, electrochemistry, catalysis, and energy conversion and storage.

More precisely the thin film obtainable using the present device and by the present method can be used in non-linear optical devices, sensors, command surfaces, molecular electronics, directional electron transfer, conductors, diodes, optical devices, pyroelectronic devices, rectifier, metal-insulator-semiconductor (MIS), single molecule detection (SMD), acoustics surface wave devices, solar energy conversion, light emitting diodes.

The thin film obtainable using the present device and by the present method can be used, in particular in, large area flexible solar cell, light emitting diode (LED) and solar fuel devices.

The invention claimed is:

1. A device for coating semiconductor/semiconductor precursor particles on a flexible substrate, wherein the device comprises:
    a container configured to contain a first solvent and a second solvent substantially immiscible with each other;
    injection means configured to inject a predetermined volume of a dispersion of at least one layered semiconductor material or its precursor(s) in the form of particles from underneath and up to a liquid-liquid interface formed within the container and between the first solvent and the second solvent, and creating a film of particles at the liquid-liquid interface;
    a first support means configured to be able to be at least partially submerged in the first solvent, wherein the first support means is configured to support at least a portion of a substrate;
    substrate extracting means configured to exert a force on the substrate causing the substrate to be drawn away from the liquid-liquid interface;
    substrate supply means configured to provide a supply of the substrate; compression means, configured to reduce a distance between particles of the at least one layered semiconductor material or its precursor(s) of the film at the liquid-liquid interface and push the film onto the substrate, wherein the compression means comprises a plurality of means for pushing mounted on a drive device, the plurality of means for pushing configured such that at least two of the plurality of means for pushing may be at least partially submerged in the second solvent during rotation of the drive device, and moved through the second solvent toward the first support means.

2. The device according to claim 1, wherein the plurality of means for pushing are substantially perpendicular with respect to drive direction and substantially perpendicularly with respect to plane, when they are submerged in the second solvent.

3. The device according to claim 1, wherein a means for pushing comprises at least two substantially parallel pushing bars.

4. The device according to claim 3, wherein the shortest distance between opposing faces of the two substantially parallel pushing bars is at least 50 mm and at most 150 mm.

5. The device according to claim 3, wherein the pushing bars are made of a fluorinated plastic, aluminium, steel, brass, stainless steel.

6. The device according to claim 1, wherein the number of means for pushing is at least 3.

7. The device according to claim 1, wherein the drive device comprises elements made of: tetrafluoroethylene-perfluoropropylene (FEP), ethylene-tetrafluoroethylene (ETFE), polyfluoroalkoxy (PFA), polyvinylidene fluoride (PVDF), polyvinyl chloride (PVC), polypropylene (PP); polyurethane; polychloroprene (pc-rubber); metals or metal alloys.

8. The device according to claim 1, wherein the first support means, the substrate extracting means, and the substrate supply means, each comprise one or more rollers.

9. A method for preparing a semiconducting thin film on a substrate surface using a device as claimed in claim 1, comprising the following steps:
    (1) providing a liquid-liquid interface of a first solvent and a second solvent, wherein the first solvent is polar, and the second solvent is non-polar;
    (2) providing at least one layered semiconductor material or its precursor(s) in the form of particles in a third solvent in the form of a dispersion;
    (3) injecting the dispersion of step (2) at the liquid-liquid interface obtained in step (1), in order to obtain an assembly of semiconductor/semiconductor precursor particles at the liquid-liquid interface;
    (4) bringing the assembly of semiconductor/semiconductor precursor particles at the liquid-liquid interface obtained in step (3) into contact with a flexible substrate; and
    (5) applying a surface pressure to the dispersion obtained in step (4) using the compression means, in order to obtain a particle film of semiconductor/semiconductor precursor on the substrate,
    wherein the first solvent has a higher density than the second solvent;
    wherein the first solvent and the second solvent are immiscible with each other and their densities are different by at least 0.01 g/mL; and
    wherein the third solvent is miscible at least with one of the first solvent or the second solvent.

10. The method according to claim 9, wherein the at least one layered semiconductor material is a transition metal dichalcogenide.

11. The method according to claim 9, wherein at least one layered semiconductor material or its precursor(s) are in the form of nanoflakes with a significantly larger dimension in a direction perpendicular to the thickness direction.

12. The method according to claim 9, wherein the transition metal-dichalcogenide is selected from the group consisting of MOS2, $WS_2$, $MoSe_2$, $WSe_2$ and $MoTe_2$.

13. The method according to claim 9, wherein the first solvent is selected from the group consisting of water, carboxylic acids, alcohols, ketones, organic sulfoxides, organic nitriles, amides and mixtures thereof.

14. The method according to claim 9, wherein the first solvent is selected from the group consisting of water, acetic acid, ethylene glycol, methanol, ethanol, n-propanol, n-butanol, acetone, ethyl acetate, dimethyl sulfoxide, acetonitrile, dimethylformamide (DMF), dimethylsulfoxide (DMSO) and mixtures thereof.

15. The method according to claim 9, wherein the second solvent is selected from the group consisting of linear and cyclic hydrocarbons, ethers and mixtures thereof.

16. The method according to claim 9, wherein the second solvent is selected form the group consisting of pentane, hexane, heptane, octane, benzene, diethyl ether and mixtures thereof.

17. The method according to claim 9, wherein the third solvent is selected from the group consisting of hexylamine, isopropanol, butanol, hexanol, water and mixtures thereof.

18. The method according to claim 9, wherein the third solvent is hexylamine, hexanol or tert-butanol or a mixture thereof.

19. The method according to claim 9, wherein the combination of the first solvent, the second solvent, and the third solvent is: ethylene glycol, hexane, and hexylamine; water/acetonitrile, pentane and tert-butanol; or water, heptane and n-butanol.

20. The method according to claim 9, wherein the substrate is selected from the group consisting of indium-doped tin oxide (GGO) and fluorine-doped tin oxide (FTO)-coated polyethyleneterephthalate (PET).

21. The method according to claim 9, wherein the angle of extraction of the substrate, with respect to the plane of the top of the mixture of the first and second solvents, is at least 10°.

22. A semiconducting thin film prepared by the method according to claim 9.

* * * * *